Oct. 3, 1967 I. A. LESK 3,345,221

METHOD OF MAKING A SEMICONDUCTOR DEVICE HAVING IMPROVED PN JUNCTION AVALANCHE CHARACTERISTICS

Filed April 10, 1963

INVENTOR.
Israel Arnold Lesk

BY Mueller & Aichele

ATTY'S.

United States Patent Office 3,345,221

Patented Oct. 3, 1967

3,345,221

METHOD OF MAKING A SEMICONDUCTOR DEVICE HAVING IMPROVED PN JUNCTION AVALANCHE CHARACTERISTICS

Israel Arnold Lesk, Scottsdale, Ariz., assignor to Motorola, Inc., Chicago, Ill., a corporation of Illinois Filed Apr. 10, 1963, Ser. No. 271,952

5 Claims. (Cl. 148—175)

This invention relates to the semiconductor art and particularly to a method for making planar junction devices having improved avalanche characteristics.

The planar PN junction is formed by selective diffusion and is of a form such that the edge of the diffused junction terminates at the surface of the semiconductor substrate. Surface effects at the edge of the junction often cause avalanche breakdown to occur there at a lower voltage than would be expected according to the impurity concentration gradients of the bulk region. Avalanche breakdown at the surface is often highly variable with the conditions under which the semiconductor device is operated and as a result the junction may show a large degree of instability.

For stable operation of the device in or near the avalanche breakdown region, it is desirable to have the minimum voltage at which surface avalanche breakdown can occur be higher than that of the bulk. This causes avalanche breakdown to occur preferentially in the more stable bulk regions of the junction.

Accordingly, it is the object of this invention to improve the stability of PN junctions with respect to avalanche breakdown by causing it to occur preferentially in the bulk material.

The invention features a method for making a planar junction structure such that the impurity concentration gradient of the junction at the surface is significantly smaller than in the bulk so that avalanche breakdown preferentially occurs in the bulk.

The present invention, briefly summarized, consists of a method of preparing planar PN junctions so that impurity concentration gradients at the surface are smaller than those for the junction within the more stable bulk material. Thus, when a sufficiently high reverse voltage is applied across the junction, avalanche breakdown occurs in the bulk portion of the junction.

Under such conditions, avalanche breakdown occurs at about the same voltage regardless of some surface conditions which ordinarily might tend to cause it to occur at a different voltage depending on the operating environment.

Figure 1:
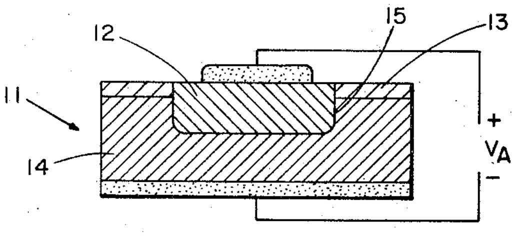
FIG. 1 shows the active element of a planar diode with a junction having a high resistivity P region peripheral about a planar N diffused region and with a lower resistivity P region beneath the other regions.

The diode 11 shown in FIG. 1 has a structure in accordance with this invention. The N region 12, formed by selective diffusion, is planar and has its complete junction periphery terminating at the surface of the chip. The chip is composed of two layers of P-type material 13 and 14. The lower region 14 has the lower resistivity and the bottom of the N region 12 extends into this material. The upper layer of higher resistivity P material 13 surrounds the N region 12 at the surface as well as somewhat below the surface. Under reverse bias, $V_A$, high enough for avalanche voltage to occur in the bulk, the junction region 15 at the surface will not be ready to break down if the resistivity of the upper P region 13 is suitably high. The resistivity of the P region 13 is considered suitably high when its corresponding breakdown voltage, neglecting surface effects, exceeds $V_A$ by an amount great enough so that probable surface effects tending to lower the breakdown voltage are unable to lower it below $V_A$.

Figure 2A:
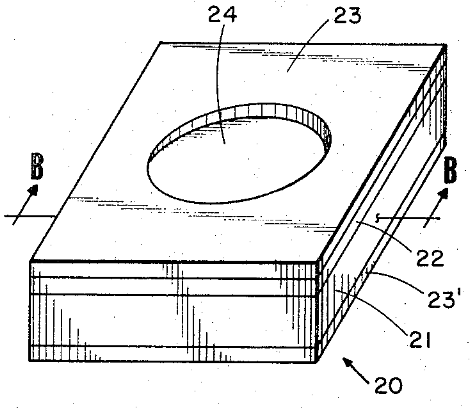
FIG. 2 shows the steps in preparing an embodiment of this invention.
Figure 2B:
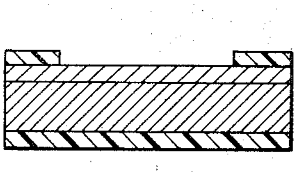
Figure 2C:
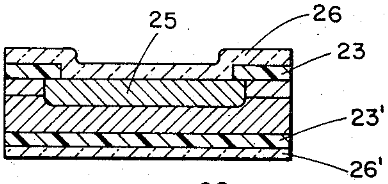
Figure 2D:
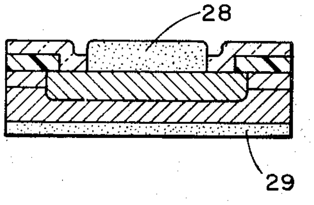
Figure 3A:
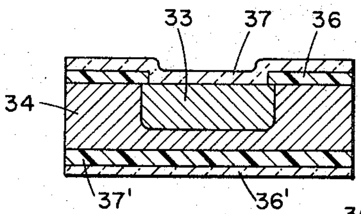
FIG. 3 shows the preparation of another embodiment in which two selective diffusion operations are used to form the desired junction structure.
Figure 3B:
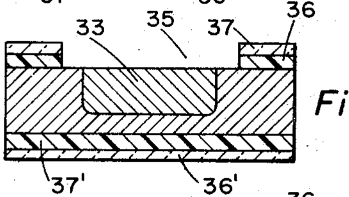
Figure 3C:
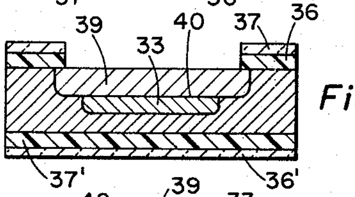
Figure 3D:
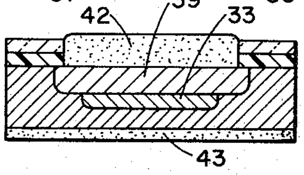

FIGS. 2A and 2B show a substrate or chip of P-type silicon 21 on which a layer of high resistivity P-type silicon 22 has been grown by epitaxial methods. Subsequently, a film of silicon dioxide 23 and 23' was thermally grown on top and bottom surfaces of the wafer and an opening 24 placed in the silicon dioxide 23 preparatory to forming an N region by selective diffusion. The N region 25 (FIG. 2C) is formed deeply enough to pass through the high resistivity P region 22 and into the lower resistivity P region 21. The glass film 26 and 26' was grown to form the impurity source for the N-type diffusion. After the diffusion step (not shown), the glass 26' and oxide 23' is lapped or etched from the bottom surface and an opening made in the glass 26 covering the N region. Contacts of metal 28 and 29 are formed on the N region (FIG. 2D) and the bottom surface of the wafer by vacuum metallizing. Subsequently, the active element is assembled to a suitable header and sealed or otherwise encapsulated.

FIG. 3A through FIG. 3D shows another method of preparing a junction in which avalanche breakdown occurs preferentially in the bulk semiconductor material. By selective diffusion a low resistivity P region 33 is formed on a P-type chip 34 and a circular region 35 on the chip is stripped of silicon dioxide 36 and glass 37 to a diameter slightly larger and concentric with the extreme boundary of the diffused region. An N region 39 is formed by diffusion through the opening in the films to form the PN junction 40 which is adjacent high resistivity material at the surface and low resistivity beneath. Contacts of metal 42 and 43 to the N region 39 and the chip are formed and the device assembled as in the manner of the first embodiment.

The sequence in which the two selective diffusions forming regions 33 and 39 are performed is not critical. The larger diameter N region may be diffused first and then the small P+ region diffused through it if desired. Additionally, for the embodiments of the invention, the active elements and the methods described for their preparation have been for n-p junctions, however, p-n junctions of the analogous structure are as readily prepared and in a similar manner and it is intended that the scope of the invention include them.

In accordance with this invention, semiconductor devices with PN and NP junctions having improved stability at or near avalanche breakdown voltage may be prepared.

I claim:

1. A method of making a rectifying junction in a semiconductor body so that avalanche breakdown of said junction tends to occur beneath the surface of said body, said method comprising, epitaxially growing on a surface of a semiconductor crystal of one conductivity type a semiconductor layer of the same conductivity type as said crystal but of higher resistivity than the underlying crystal material, and selectively diffusing an impurity of opposite conductivity type to form a semiconductor region extending through only a portion of said layer to define a rectifying junction extending from beneath said layer to form a region of opposite conductivity semiconductor material defining a rectifying junction which extends continuously within the bulk of said crystal and between said opposite conductivity region and said semiconductor crystal and through said semiconductor surface layer of higher resistivity to the surface of said body whereby the portion of said rectifying junction bounded by said underlying semiconductor crystal of said one conductivity type and by said opposite conductivity region will break down at a lower reverse voltage than the portion of said rectifying junction bounded by said semiconductor surface layer of higher resistivity.

2. A method of making a rectifying junction in a semiconductor body so that avalanche breakdown of said junction tends to occur beneath the surface of said body, said method comprising, diffusing an impurity into a semiconductor body to form a first region with said body of one conductivity type defining a rectifying junction, and selectively diffusing another impurity through a portion only of the first-diffused region and into the underlying material to form a second region of the same conductivity type as said underlying material, opposite in conductivity to said first region and having a lower resistivity than said underlying material; said first and second regions defining a portion of said rectifying junction therebetween which will undergo reverse breakdown at a lower voltage than the portion of the rectifying junction defined by the first region and the semiconductor body of relatively high resistivity semiconductor material into which it is diffused.

3. A method of making a rectifying junction in a semiconductor body so that avalanche breakdown of said junction tends to occur beneath the surface of said body, said method comprising the steps of forming in said body a first region of the opposite conductivity type than said body to form a rectifying junction, and selectively diffusing an impurity through a portion of said junction to form a second region of the same conductivity type as said body and of a lower resistivity than said body; the portion of the rectifying junction bounded by said second region of said lower resistivity and by said first region undergoing reverse voltage breakdown at a lower voltage than the portion of the rectifying junction bounded by said body and by said first region due to the relatively high resistivity material of the semiconductor body at the surface portions of said junction and the relatively low resistivity material of said second region beneath the surface of said body.

4. A method of making a rectifying junction in a semiconductor wafer of one conductivity type so that avalanche breakdown tends to occur beneath the surface of said wafer, said method comprising the steps of forming by selective diffusion into a portion of one side of said wafer a first region of the same conductivity type but having a lower resistivity than said wafer, and forming by diffusion a second region of the opposite conductivity type on the same side of said wafer to define a rectifying junction at a depth less than that of said first region so that said junction is bounded by high resistivity material at the surface portions of the junction and by lower resistivity material beneath said surface.

5. A method of forming a rectifying junction within a semiconductor body so that the resistivity of at least one region of the body and defining a portion of the rectifying junction adjacent the surface of the body is higher than the resistivity of another region of the body and defining a portion of the rectifying junction within the bulk of the body, said method comprising the steps of forming a region of relatively high resistivity semiconductor material of one conductivity type on a substrate of the same conductivity type semiconductor material but of lower resistivity, and thereafter selectively diffusing an impurity of the opposite conductivity type through only a portion of said relatively high resistivity region and extending into said substrate and defining a first portion of the rectifying junction within the bulk of the semiconductor body and bounded by said lower resistivity region, a second portion of the rectifying junction bounded by said relatively high resistivity region adjacent the surface of said body and enabling the first portion of the rectifying junction bounded by said lower resistivity region to break down at a lower reverse voltage than the second portion of the rectifying junction adjacent said relatively high resistivity region at the surface of said body.

References Cited

UNITED STATES PATENTS

| | | | |
|---|---|---|---|
| 2,561,411 | 7/1951 | Pfann | 148—187 |
| 3,044,147 | 7/1962 | Armstrong | 148—186 |
| 3,105,177 | 9/1963 | Aigrain | 317—234 |
| 3,155,551 | 11/1964 | Bennett | 148—191 |
| 3,164,498 | 1/1965 | Loeb et al. | 148—177 |
| 3,180,766 | 4/1965 | Williams | 148—33 |
| 3,183,128 | 5/1965 | Leistiko et al. | 148—33.5 |
| 3,183,129 | 5/1965 | Tripp | 148—186 |
| 3,197,681 | 7/1965 | Broussard | 317—235 |
| 3,223,904 | 12/1965 | Wainer et al. | 148—175 |
| 3,260,902 | 7/1966 | Porter | 148—175 |

DAVID L. RECK, *Primary Examiner.*

JOHN W. HUCKERT, *Examiner.*

J. SHEWMAKER, N. F. MARKVA, *Assistant Examiners.*